US006087581A

United States Patent [19]

Emmer et al.

[11] Patent Number: 6,087,581

[45] Date of Patent: Jul. 11, 2000

[54] REGENERABLE THERMAL INSULATION AND COOLING ELEMENTS INSULATED THEREBY

[75] Inventors: Claus Emmer, Prior Lake; Jon Robert Turner, Lakeville; Timothy A. Nesser, Savage, all of Minn.

[73] Assignee: MVE, Inc., Burnsville, Minn.

[21] Appl. No.: 09/093,378

[22] Filed: Jun. 8, 1998

[51] Int. Cl.[7] .......... H05K 5/00

[52] U.S. Cl. .......... 174/17 R; 174/50

[58] Field of Search .......... 174/17 R, 50; 220/3.2, 3.8

[56] References Cited

U.S. PATENT DOCUMENTS

| | | | |
|---|---|---|---|
| 2,225,945 | 12/1940 | Appleton | 220/3.2 |
| 2,345,792 | 4/1944 | Cann | 174/50 X |
| 3,143,594 | 8/1964 | Derby | 174/17 R |
| 3,147,877 | 9/1964 | Beckman | 220/9 |
| 3,595,275 | 7/1971 | Steans et al. | 138/114 |
| 4,156,998 | 6/1979 | McClure | 174/50 X |
| 4,215,798 | 8/1980 | Patterson et al. | 220/421 |
| 4,889,209 | 12/1989 | Sears | 220/3.2 X |
| 4,997,124 | 3/1991 | Kitabatake et al. | 228/184 |
| 5,159,155 | 10/1992 | Nishihara | 174/50 |
| 5,243,130 | 9/1993 | Kitigawa | 174/50 |
| 5,591,938 | 1/1997 | Navazo | 174/50 |
| 5,703,325 | 12/1997 | Yamaguchi et al. | 174/50 |
| 5,828,544 | 10/1998 | Matsuda | 174/50 X |

FOREIGN PATENT DOCUMENTS

| | | | |
|---|---|---|---|
| 2139311 | 5/1983 | United Kingdom | F16L 59/06 |

*Primary Examiner*—Dean A. Reichard

*Attorney, Agent, or Firm*—Schwegman, Lundberg, Woessner & Kluth, P.A.

[57] ABSTRACT

An insulation system is described which includes a containment wall with an inner surface and an outer surface, the inner surface at least in part defining a volume for containment of fluids or solids, an absorbent material which releases absorbed material when heated, the absorbent being in thermal contact with the outer surface of the containment wall, a structural wall contiguous to the outer surface of the containment wall, and an interior surface of the structural wall and the outer surface of the containment wall defining a volume of space where a vacuum can be maintained. The insulation system is used in a process for improving the performance of the insulation system, the process comprising the steps of:

a) heating the containment wall to a temperature which will heat the absorbent material to a temperature which will cause the absorbent material to release absorbed material, b) removing the released absorbed material from the vacuum zone, and c) closing the vacuum zone, while under a reduced pressure to exclude ambient passage of gas into the vacuum zone. The process is highly effective even where the reduced pressure of step c) is substantially less than 0.25 Torr.

20 Claims, 1 Drawing Sheet

REGENERABLE THERMAL INSULATION AND COOLING ELEMENTS INSULATED THEREBY

BACKGROUND OF THE INVENTION

1. Field of the Invention

The present invention relates to thermally insulated transport systems, insulated containers and insulation structures. In particular, the present invention relates to thermally insulated structures where the thermal insulation works in a reduced pressure environment and certain segments of the insulation system which display reduced performance over time can be regenerated without replacement of the thermal insulation system.

2. Background of the Art

Thermal insulation is widely used throughout all aspects of technology and sciences. Every structure and device from housing to superconductors involves consideration of the need for avoiding undesirable heat transfer within the system. The fundamental physics of thermal insulation can be usually resolved in the single consideration that thermal transfer across any volume will be minimized if the mass within that volume is minimized. Heat transfer by both conduction and convection are eliminated in the absence of mass surrounding the mass having heat energy. Only radiant energy can pass over the volume, and that can be reduced by the proper arrangement of reflectors and black body absorbers.

Reduced mass within the insulating volume is used both with cold storage systems and high temperature systems. The structures for reducing heat transfer to or from a volume or area generally comprise a central container with walls (including pipes, tubing, refrigeration elements, transient storage containers such as boilers, condensers and furnaces) where the reduced transmission of heat is important. Around the walls is an insulating zone. The primary objective of the insulating zone is to provide the minimum amount of mass, and the minimum amount of thermally conductive mass, between the outside walls of the central container and an outer shell, which is usually the visible external walls of the device or system. The volume between the outer surfaces of the central container and the outside walls is the section of the device or system containing insulation. The insulation may take many forms, such as a vacuum (with a minimum number of thermally insulating contact or support points separating the outside surface of the central container and the inside surface of the outside walls), a highly porous material, such as a foam (e.g., polyurethane, polystyrene, ureaformaldehyde, etc.), reticulated structures (such as blown microfibers, foams with collapsed cell walls, etc.), fibrous material (synthetic non-woven materials, fiberglass, ceramic fibers, and natural materials such as asbestos), and the like. The structure and composition of each of these types of insulation still works on the principle that the lowest volume of mass (especially gases which can readily convey energy through mass transfer) and the use of the most thermally insulating solid materials will provide the best insulation.

In systems which rely most strongly upon the presence of reduced pressure or a vacuum to provide insulation between the central container and the outside walls, it is important to keep the specific level of reduced pressure at a minimum and to keep that pressure constant. This is particularly true in cryogenic systems where temperatures below −50, −75, −100° C., or lower are used. Even though a vacuum may be originally presented within the system, there can be extremely small leaks, vapor pressure generated by volatiles or ingredients within the insulation zone (e.g., plasticizers on polymers and adhesives, the natural vapor pressure of atomic or molecular materials, unreacted ingredients in coatings, degradation products from materials, etc.), and the like. The addition of these types of materials to the vacuum zone or insulation zone are particularly annoying because they change over time. In systems where temperature control is critical (as in chemical reaction systems, superconductive electric transmission systems, laser systems, cryogenic storage, and the like), fluctuations in the insulating properties can alter critical temperature requirements for the system, and these changes vary irregularly over time. Because they change irregularly over time, adjustments to the system must usually be effected periodically, with high labor utilization, and these corrections and adjustments can be inexact.

One way of addressing this type of variation in the vacuum over time has been to place a packet of absorbent material (e.g., referred to in the art as a "getter"). Getters are materials which usually chemically react with expected molecular contaminants within the vacuum area and thus remove them from the air. Getters typically react with materials by activation upon heating, as compared to absorbents for gases which work more efficiently when the temperature drops. With absorbents, the lower the temperature, the greater the weight of gas which can be absorbed. These getters, in some cases, happen to be materials from which the reacted chemicals can be driven by heating the getter outside of the container to reverse the chemical reaction which bonds the contaminants to the getter. Where the system is completely closed, these getters will eventually fill up, and replacement of the packets of getters is time consuming and somewhat inefficient, since after opening the system, the packet of getters is inefficient in cleansing out the entire vacuum zone.

SUMMARY OF THE INVENTION

A vacuum system comprises an inner wall (to be in contact with a mass or volume whose temperature is to be maintained or from which or to which heat exchange is to be prevented), an outside enclosure (e.g., an outer wall or structural wall), and an area of reduced pressure between the inner wall and the outer wall. The inner wall has an interior surface (facing the mass) and an exterior surface (facing the outer wall). The exterior surface of the inner wall has a layer (continuous or discontinuous) of thermally regenerable absorbent material in thermal contact with the inner wall. After the regenerable absorbent material has been determined or estimated to have absorbed a significant or high level of its capacity for contaminants, the inner wall is heated (or heat is introduced into the vacuum zone, preferably with an inert atmosphere such as nitrogen or other inert gases), the vacuum zone is evacuated (removing contaminants driven from the layer of regenerable absorbent material by the heat), the vacuum zone is resealed, and the insulation system is therefore intact again.

DETAILED DESCRIPTION OF THE INVENTION

Figure 1:
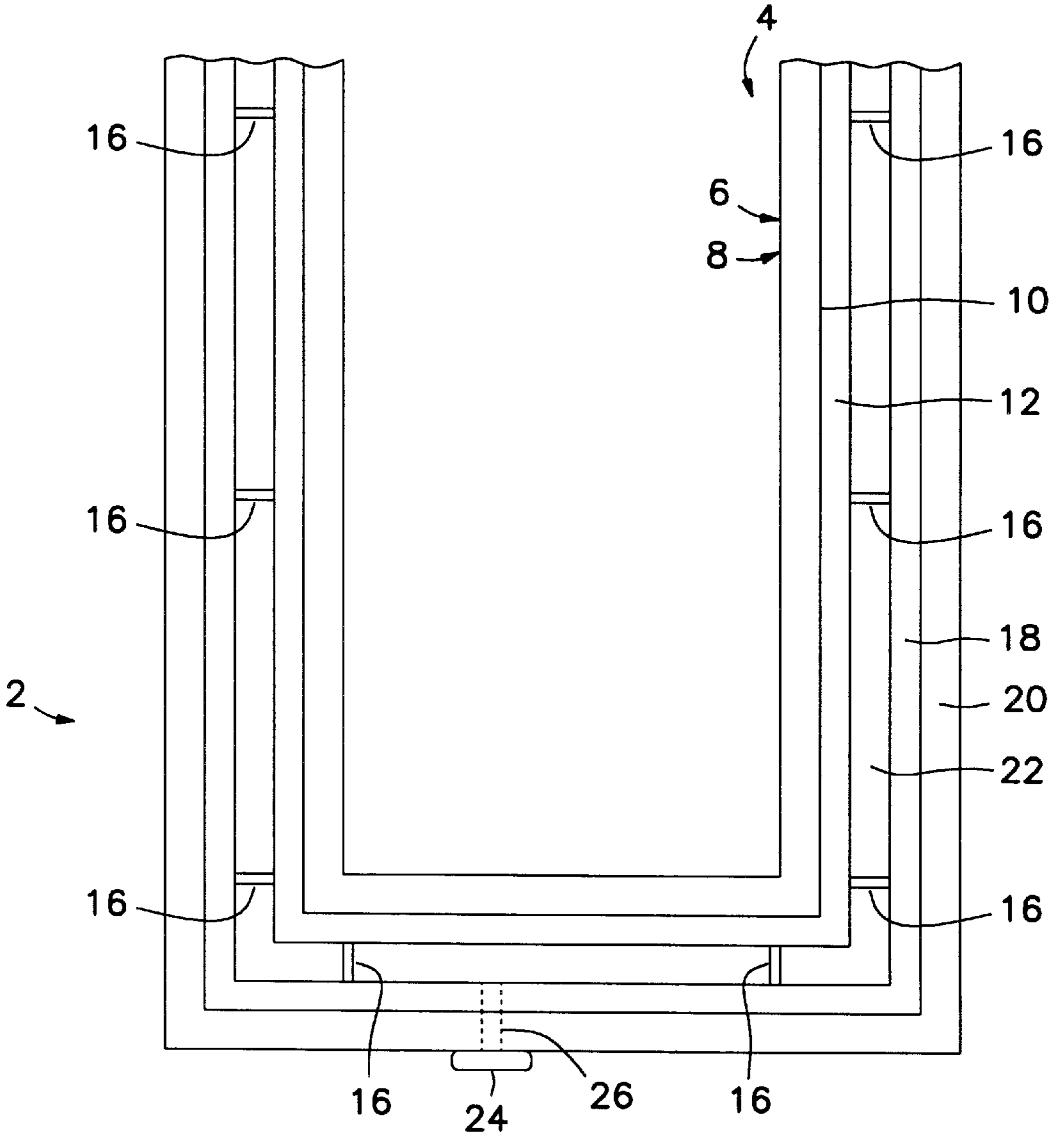
FIG. 1 shows a cross-section of an insulated tank.

The present invention comprises an insulation system having at least a physical containment wall (having an interior surface which is to face a mass to and from which the transfer of heat is to be controlled, reduced or eliminated and an outer surface), an exterior or structural wall (e.g., contiguous with the outer surface of the containment wall), and a reduced pressure volume or zone between the exterior surface of the containment wall and the interior surface of the structural wall. The exterior surface of the containment wall which faces the reduced pressure zone has a layer of regenerable absorbent material thereon. The layer may be continuous (covering all or a part of the exterior surface of the containment wall) or discontinuous (covering a portion of the exterior surface of the containment wall). Although it is preferred to have the absorbent material cover all of the exterior surface of the containment wall (primarily from the standpoint of ease of coating, and provision of the greatest surface area and volume of absorbent), a continuous coating is not essential to the practice of the present invention. Sufficient regenerable absorbent material must be provided to effectively maintain a reduced level of vapor contaminants, but this can be provided in a discontinuous or partial coating or layering of the exterior surface of the containment wall. For example, stripes of the absorbent material (e.g., covering from 100% or nearly 100% [e.g., 99%] of the surface) can be provided, as could concentric rings, and random patterns of the absorbent material. The discontinuous coating, if reasonably distributed over the surface of the containment wall (as opposed to being only on one end of the wall in a small area), can be as effective as a continuous coating, although only providing a volume absorption capability which is a fraction of that of a continuous coating. The discontinuous coating can reduce the cost of materials applied.

The use of a layer of the absorbent material provides a significant improvement over the use of loose fill of absorbents or the packages of absorbent or getter. The packaged absorbent, even with a large volume of material, provides only a small surface area into contact with the volume in the vacuum chamber, creating a long equilibration time. Additionally, the absorbent would not be easily regenerable, and could not be reasonably regenerated by heating of the containment wall, mainly because the absorbents tend to be thermal insulators and resist thermal transfer from a side of the packet touching the interior wall or exposed to the vacuum zone into the remaining mass of absorber. A loose fill of absorbent material is similarly ineffective, both from the standpoint of effective surface area in contact with the volume of the vacuum zone and from the standpoint of potentially inefficient regeneration, particularly by heating of the containment wall. The loose fill shifts around within the vacuum zone, and presents a minimal mass of material into effective thermal contact with the containment wall at any given time. Because the absorbent materials often tend to be thermal insulators (e.g., porous), they are thermal insulators to some degree, particularly when freely moving within the vacuum zone and allowed to collect as a single mass with a significant volume not in accessible thermal contact with an outer surface of the containment wall. The use of a coating or controlled thickness layer of absorbent according to the present invention over the exterior surface of the containment wall enables the use of these absorbents, even when essentially insulating materials are used as absorbents against the exterior surface of the containment wall in a manner which enables heating of the absorbent through the surface of the containment wall and through the thin mass of absorbent on that surface.

For example, present usage of absorbent in vacuum zones in insulated systems may have as much as a four to six inch (10.2 to 15.3 cm) thickness of absorbent in a small percentage of the vacuum zone. Heat would have to conduct through the mass slowly if the containment wall is heated to drive off absorbed material. Heating the wall to a temperature of 250° F. (121° C.) would be necessary with such packaged or loose absorbent materials to heat the outer surface of this mass of absorbent to 160° F. (71° C.). It is a preferred practice of the present invention that the thickness of absorbent be able to maintain a gradient from the side in contact with the surface of the containment wall of less than 20° C. to the outermost surface of the absorbent layer with an equilibration time of 1 hour at a temperature of 120° C. for the exterior surface of the containment wall. It is preferred that this gradient be less than 15° C., and more preferred that it be less than 10° C. at these temperatures. It is preferred that the gradient be less than 20° C. after one hour equilibration time when the outer surface of the containment wall is maintained at a temperature of 200° C. and more preferably at 150° C. or 125° C.

It is not essential to the practice of the present invention that all of the absorbent within the vacuum zone (between the exterior surface of the containment wall and the interior surface of the structural wall) be in thermal contact with the outer surface of the containment wall. It should be understood, however, that the removal of absorbent from thermal contact reduces the rate at which the absorbent can be regenerated by heating of the containment wall. It is preferred that at least 50% by weight of the absorbent be in thermal contact with the exterior surface of the containment wall, such that when the containment wall is heated up to 450° F. for two to three hours, at least 70% by weight of the absorbed material within the absorbent that is within the vacuum zone is removed from the absorbent and removed when the vacuum zone is vented.

Although the absorbent has been described as a coating, it does not actually have to be directly coated onto the exterior surface, but can be provided as a layer of material laid on the surface or wrapped on the surface. The important aspect is the thermal contact between the layer of absorbent material and the exterior surface of the containment wall so that thermal energy applied to the containment wall will be transferred to the absorbent layer to assist in the regeneration of that layer. The layer of thermally regenerable absorbent may be provided as a direct coating onto the exterior surface of the containment wall, as by adherence of the absorbent to the wall, sintering of the absorbent to the wall, adhesive securement of the absorbent to the wall (taking assurance that the adhesive does not cover such a significant amount of the absorbent's surface as to render its absorbency ineffective. An adhesive which is present in a weight proportion to the absorbent of as little as 0.4% by weight can be effective in adhering the particulate material to the wall. A metal film (with or without backside adhesive) may be used to carry the absorbent into thermal contact with the exterior surface of the containment wall. A self-supporting film of the absorbent may be adhesively secured to the exterior wall or a sintered sheet of absorbent particles adhesively secured to the exterior surface of the containment wall. Other types of sheets of materials may be provided to the exterior surface of the containment wall, as long as the layer does not provide significant thermal insulation which would prevent thermal energy from being transferred from the containment wall to the absorbent, thus preventing simple regeneration of the absorbent. The sheets may be continuous or discontinuous and the absorbent on the sheets may be continuous or discontinuous. This feature would also allow replacement of the sheet of absorbent after many years of use should the absorbent ultimately break down and need replacement after repeated regeneration.

The nature of the absorbent may be selected from amongst a wide range of commercially available materials. Amongst the types of materials available are chromatographic media (e.g., polystyrenesulfonate polymer, preferably cross-linked with divinyl compounds such as divinyl benzene, silica powders, etc.), cation exchange media, anion exchange media, charcoal, activated charcoal, natural minerals (zeolites), and molecular sieves. These classes of materials absorb or adsorb molecular materials (particularly out of a vapor phase) by ionic bonding, hydrophilic/hydrophobic bonding, and/or reversible chemical reactions). For example, foams and particulates which are able to bond water of hydration into their molecular structures (e.g., silicates, aluminates, hygroscopic metal oxides, etc., especially the zeolites and molecular sieves such as the aluminosilicates having the structural formula $MnO.Al_2O_3.xSiO_2.yH_2O$, wherein M is a metal ion and n is twice the reciprocal of the valence of the metal ion, and y is a positive integer representing the number of molecules of water of hydration attached to the aluminosilicate), compositions having chelating or sequestering groups (e.g., carboxylic acid or ester groups, sulfonic acid or ester groups, phosphoric or phosphonic acid or ester groups, exposed ring nitrogen atoms, etc.), or materials with strong centers of electric distribution can be used in the practice of the present invention. The absorption medium should itself display little capability of releasing atoms or molecules into the environment which would provide a vapor pressure. For example, it is an objective of the higher quality insulation systems to maintain a reduced vapor pressure of less than 0.25 Torr within the vacuum zone or insulation zone. Preferably the vapor pressure is to be below 0.15 Torr, more preferably below 0.1 and below 0.05 Torr, and most preferably below 0.02, below 0.015 and below 0.010 Torr at 20° C. or even at 50° C. In the use of cooled systems or cryogenic systems, these vacuum levels must be maintained when the outside surface of the containment wall is at temperatures of −200° C., −150° C. or −100° C. To that end, it is important that the absorption medium itself does not display a vapor pressure as high as these limits. It is also desirable that the absorption medium is able to reduce the vapor pressure within a closed environment to below these levels. For example, in a sealed environment which has been evacuated to 0.25 Torr air pressure with 40% relative humidity, the absorbent material (if targeting reduced levels of water vapor pressure) should be able to absorb moisture from that closed environment without increasing the total vapor pressure within the closed environment when the ratio of the volume of absorbent to the total volume in the closed environment is approximately between 0.01 and 0.50, preferably between 0.05 and 0.2, such as about 0.10 (the enclosed environment is ten times the volume of the absorbent).

The absorbent material should be considered with respect to the type of vapor materials it is likely to encounter within its specific environment of use. Typically the absorbent should be able to absorb and subsequently release water vapor. The absorbent may also have to absorb such materials as common atmospheric gases (e.g., carbon dioxide, nitrogen, oxygen, water vapor), acid vapors, low molecular weight (e.g., less than 500) organic materials, inorganic materials, including solvents and unreacted reagents, sizing agents, plasticizers, decomposition products, acids, bases, and the like. Commercial information is available on absorbent materials which can be used to help one of ordinary skill in the art select specific absorbents for specific needs.

The amount of absorbent material which is desirable or needed within the insulation or vacuum zone is dependent upon a number of factors. If the volume of the insulation zone is large, there would be a desire to have larger volumes of absorbent. If the criticality is high or tolerance for vapor pressure change is extremely small, larger quantities of the absorbent would be desirable. If reduced intervention into the vacuum zone to regenerate the absorbent was desirable (e.g., to minimize equipment shut down), larger amounts of absorbent are needed. In general, however, because of the small volumes within the vacuum zones and the high efficiency of the absorbents and the fact that the volumes are evacuated by mechanical means before the absorbents must operate independently, only relatively small amounts of absorbent are needed. The use of thin layers of the absorbent are also desirable from the standpoint of making rapid initial activity (a large surface area to volume ration of absorbent to vacuum volume) and regeneration of the absorbent easier because of the smaller amount of heat and shorter time period necessary to remove the captured absorbed materials. Thus, particles or coatings of absorbent materials having 0.05 microns in diameter or thickness, respectively, would be effective and desirable. Layers of absorbent (excluding metal or thermally conductive support layers) of from 0.05 to 1000 microns or even up to 10 centimeters in thickness can be effective in the practice of the present invention. Even larger thicknesses may be used, but at increased expense in materials. Ratios of the volumes of the absorbent as compared to the volume of the vacuum zone to be maintained may range from less than about 0.001 to 0.50, and are preferably in the range of 0.005 to 0.10 volume of absorbent to the volume of the vacuum zone (the volume between the exterior surface of the containment wall and the interior surface of the structural wall, usually inclusive of the insulation layer or layers on the internal surface of the structural wall). As noted, the layer of absorbent is fixed to the outer surface of the containment wall, with the absorbent being unable to slide or shift freely against that wall. This is in contrast to materials loosely filling a portion of the vacuum zone or contained in a packet or bag which allows shifting of material within the packet or container. At least 50% by weight, preferably at least 75% by weight, more preferably at least 80% or at least 90% by weight of all absorbent should be in a fixed position against the outer surface of the containment wall, meaning that it cannot shift its position relative to the containment wall if the container shifts its position.

As noted, the absorbent can be provided in any available format as long as the absorbent is in sufficient thermal contact with the exterior surface of the containment wall so that heating of the containment wall (within reasonable temperatures, such as between 300 and 600° F. to remove absorbed material) will heat the absorbent material to a temperature sufficient to release and drive off absorbed material. The absorbent may be provided as a fused, sintered, or continuous solid layer (e.g., vacuum deposited, sputtered, vapor deposited, etc.), as an adhesively secured layer (as with an adhesive coating on the exterior surface of the containment wall with the particles adhered thereto without complete coating of the absorbent particles), as a carrying sheet with the absorbent on the surface of the sheet, and the like. The sintered layer (as a self-sustaining layer or as a layer supporting on a thermally conductive sheet) may be solely absorbent particulates, mixtures of absorbent particulates of different types, or mixtures of absorbent and adhesive particulates. It is important, as previously noted, to assure that the entire surface of the absorbent is not covered by adhesive or other material, which would prevent it from effectively absorbing vapor.

A process according to the present invention comprises the steps of:

a) heating the containment wall to a temperature which will heat said absorbent material to a temperature which will cause the absorbent material to release absorbed material, b) removing the released absorbed material from the vacuum zone, and c) closing the vacuum zone, while under a reduced pressure to exclude ambient passage of gas into the vacuum zone. It is preferred that the reduced pressure of step c) is less than 0.25 Torr. It is also preferred that the containment wall is heated to a temperature of at least 160° F. to remove absorbed material, and that when at least 25% by volume capacity of said absorbent is filled with absorbed material, at least 70% by weight of absorbed material is driven from said absorbent by heating said containment wall to a temperature between 150° C. and 250° C. for two hours. That removed material then may be vented out of the system. This test can be readily performed by weighing an insulation element with relatively pure absorbent, calculating a maximum percent (100%) capacity, filling the absorbent to (for example) 25% by volume of that capacity, and then heating the containment wall as described and determining if 75% by weight of absorbed material has been removed.

Reference to FIG. 1 will assist in an understanding of the present invention. FIG. 1 shows a storage element or tank 2 comprising a storage volume 4, and a containment wall 6. The containment wall 6 has an inner surface 8 and an outer surface 10. In thermal contact with the outer surface 10 of the containment wall 6 is a layer of thermally regenerable absorbent material 12. The layer of thermally regenerable absorbent material 12 is shown as coextensive with the entire containment wall 6. A series of spacer or separation elements 16 in contact with the containment wall or the absorbent layer are also in contact with an insulation layer 18. This insulation layer is coextensive with a structural or shell wall or exterior wall 20. The insulation layer 18 is not essential to practice of the present invention, but is preferred and is commonly used in the insulation art. The insulation wall 18 (or the structural wall 20) defines a vacuum zone 22 which is the volume between the absorbent layer 12 and the insulation layer 18 (or the structural wall 20). A removable seal 24 covering a passage or vent 26 to the vacuum zone 22 is shown.

The element shown is a static storage environment, that is the tank 2 has no movement of cooled material within the tank. However, the present invention is clearly useful in systems where the material which is heated or cooled is in motion, as in reaction vessels, transportation systems or the like. A venting capability to the vacuum zone would still be needed to assure removal of volatiles driven off the absorbent material.

The process of using the system of the present invention would merely require construction of the insulation element with its component parts including the absorbent layer in place, evacuating the vacuum zone (usually allowing the vacuum zone to equilibrate), storing the material in the system or operating the system according to its design over a period of time, heating the containment wall and thereby heating the absorbent layer (this heating would usually be done after the storage or transportation volume within the system has been emptied, particularly if the temperature control of materials within the system are critical). The heating may be done when the vent 26 is open or closed, and the vent 26 opened at some point to apply a reduced pressure to the system to remove the vapor phase within the vacuum zone, the vapor at least in part being generated by material being thermally driven off the absorbent material by heat. The system is then closed (preferably while vacuum is still being applied to the vacuum zone), the vent is closed, and the system is allowed to equilibrate again.

What is claimed:

1. An insulation system comprising a containment wall with an inner surface and an outer surface, the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained.

2. An insulation system comprising a containment wall with an inner surface and an outer surface, the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained wherein a vent which may be closed and opened is provided through either the containment wall or said structural wall into said volume of space where vacuum can be maintained.

3. The insulation system of claim 1 wherein a vacuum of less than 0.25 Torr is maintained within said volume of space when the temperature at the outer surface of the containment wall has been 40° C. for at least 2 hours.

4. An insulation system comprising a containment wall with an inner surface and an outer surface, the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained wherein said absorbent material which releases absorbed material when heated is selected from the group consisting of compounds which capture water of hydration, chelating materials, and charcoal.

5. An insulation system comprising a containment wall with an inner surface and an outer surface, the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained wherein said absorbent material comprises a silicate.

6. The insulation system of claim 5 wherein said silicate absorbent material comprises an aluminosilicate.

7. An insulation system comprising a containment wall with an inner surface and an outer surface, the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained wherein said absorbent material comprises a zeolite.

8. The insulation system of claim 1 wherein a surface of said structural wall which faces said volume of space where a vacuum can be maintained has an insulation layer over that surface of the structural wall.

9. The insulation system of claim 2 wherein a surface of said structural wall which faces said volume of space where a vacuum can be maintained has an insulation layer over that surface of the structural wall.

10. The insulation system of claim 3 wherein a surface of said structural wall which faces said volume of space where a vacuum can be maintained has an insulation layer over that surface of the structural wall.

11. The insulation system of claim 1 wherein:

a) a surface of said structural wall which faces said volume of space where a vacuum can be maintained has an insulation layer over that surface of the structural wall, b) said absorbent material which releases absorbed material when heated is selected from the group consisting of compounds which capture water of hydration, chelating materials, and charcoal, and c) a vent which may be closed and opened is provided through either the containment wall or said structural wall into said volume of space where vacuum can be maintained.

12. A process for improving the performance of an insulation system comprising a containment wall with an inner surface and an outer surface the inner surface at least in part defining a volume for containment of fluids or solids, thermally regenerable absorbent material which releases absorbed material when heated, at least 50% by weight of the absorbent material being in fixed thermal contact with the outer surface of the containment wall, a structural wall contiguous to said outer surface of said containment wall, and an interior surface of said structural wall and the outer surface of said containment wall defining a volume of space where a vacuum can be maintained, said process comprising the steps of:

a) heating said containment wall to a temperature which will heat said absorbent material to a temperature which will cause said absorbent material to release absorbed material, b) removing said released absorbed material from said volume of space where a vacuum can be maintained, and c) closing said volume of space where a vacuum can be maintained, while under a reduced pressure to exclude ambient passage of gas into said volume of space where a vacuum can be maintained.

13. The process of claim 12 wherein said reduced pressure of step c) is less than 0.25 Torr.

14. The process of claim 12 wherein said containment wall is heated to a temperature of at least 160° F. to remove absorbed material.

15. The process of claim 13 wherein said containment wall is heated to a temperature of at least 160° F. to remove absorbed material.

16. The process of claim 12 wherein when at least 25% by volume capacity of said absorbent material is filled with absorbed material, at least 70% by weight of absorbed material is driven from said absorbent material by heating said containment wall to a temperature between 150° C. and 250° C. for two hours.

17. The insulation system of claim 6 wherein:

a) a surface of said structural wall which faces said volume of space where a vacuum can be maintained has an insulation layer over that surface of the structural wall, and b) a vent which may be closed and opened is provided through either the containment wall or said structural wall into said volume of space where vacuum can be maintained.

18. A process for improving the performance of an insulation system according to claim 6, said process comprising the steps of:

a) heating said containment wall to a temperature which will heat said absorbent material to a temperature which will cause said absorbent material to release absorbed material, b) removing said released absorbed material from said volume of space where a vacuum can be maintained, and c) closing said volume of space where a vacuum can be maintained, while under a reduced pressure to exclude ambient passage of gas into said volume of space where a vacuum can be maintained.

19. The process of claim 18 wherein when at least 25% by volume capacity of said absorbent material is filled with absorbed material, at least 70% by weight of absorbed material is driven from said absorbent material by heating said containment wall to a temperature between 150° C. and 250° C. for two hours.

20. The insulation system of claim 1 wherein said absorbent material is selected from the group consisting of chromatographic media, cation exchange media, anion exchange media, charcoal, activated charcoal, and molecular sieves.

* * * * *